(12) United States Patent
Lin (10) Patent No.: US 6,246,113 B1
(45) Date of Patent: Jun. 12, 2001

(54) INTEGRATED CIRCUIT PACKAGE ARCHITECTURE WITH IMPROVED ELECTROSTATIC DISCHARGE PROTECTION

(75) Inventor: Shi-Tron Lin, Taipei (TW)

(73) Assignee: Windbond Electronics Corp., Hsinchu (TW)

( * ) Notice: Subject to any disclaimer, the term of this patent is extended or adjusted under 35 U.S.C. 154(b) by 0 days.

(21) Appl. No.: 09/154,799

(22) Filed: Sep. 17, 1998

(30) Foreign Application Priority Data

Feb. 9, 1998 (TW) .................................. 87101686

(51) Int. Cl.[7] .............................. H01L 23/48; H01L 23/52
(52) U.S. Cl. ......................... 257/692; 257/690; 257/691
(58) Field of Search ...................................... 257/691, 690, 257/692, 666, 355, 207, 670

(56) References Cited

U.S. PATENT DOCUMENTS

| | | | |
|---|---|---|---|
| 5,220,195 | * 6/1993 | McShane et al. | 257/666 |
| 5,677,570 | * 10/1997 | Kondoh et al. | 257/690 |
| 5,691,575 | * 11/1997 | Hagiya et al. | 257/666 |
| 5,723,899 | * 3/1998 | Shin | 257/666 |
| 5,869,870 | * 2/1999 | Lin | 257/355 |
| 5,998,869 | * 12/1999 | Lin et al. | 257/666 |

* cited by examiner

Primary Examiner—Olik Chaudhuri
Assistant Examiner—Phat X. Cao (57) ABSTRACT

An IC package architecture with electrostatic discharge (ESD) protection is provided for use on an IC package for the purpose of allowing the ESD robustness of the IC package to be further enhanced and the structural complexity of the same to be further simplified as compared to the prior art. The IC package includes a lead frame having a die pad for mounting an IC chip thereon, a plurality of package pins with some no-connect pins which are grouped into at least one no-connect pin unit, each unit consisting of one single no-connect pin or a number of consecutively arranged no-connect pins. ESD protection can be provided to any no-connect pin unit on the IC package either by arranging a pair of power pins proximate to the respective sides of the no-connect pin unit; by arranging a power pin proximate to one side of the no-connect pin unit and an elongated conductive tongue proximate to the other side; or by arranging a pair of elongated conductive tongues proximate to the respective sides of the no-connect pin unit. This provides ESD protection to all the no-connect pins in the no-connect pin unit without having to connect them to ESD protection circuits.

55 Claims, 7 Drawing Sheets

INTEGRATED CIRCUIT PACKAGE ARCHITECTURE WITH IMPROVED ELECTROSTATIC DISCHARGE PROTECTION

CROSS-REFERENCE TO RELATED APPLICATION

This application claims the priority benefit of Taiwan application serial no. 87101686, filed Feb. 9, 1998, the full disclosure of which is incorporated herein by reference.

BACKGROUND OF THE INVENTION

1. Field of the Invention

This invention relates to electrostatic discharge (ESD) protections, and more particularly. to an integrated circuit (IC) package architecture with ESD protection in which the support bars or tie bars of the lead frame are arranged proximate to no-connect pins so that the ESD robustness of the IC package can be enhanced and the structural complexity of the same can be simplified.

2. Description of Related Art

Electrostatic discharge (ESD) is a movement of static electricity from a nonconductive surface, which usually causes damage to the semiconductors and various other circuit components in IC packages. A person walking on a carpet, for instance, can carry an amount of electrostatic charge up to several thousands of volts under high relative humidity (RH) conditions and over 10,000 volts under low relative humidity conditions. If such a person touches an IC package by hand, the electrostaticity on his/her body is instantaneously discharged via the pins of the IC package to the enclosed IC chip, thus causing ESD damage to the internal circuit of the IC chip. The ESD damage is particularly common and severe on CMOS (complementary metal-oxide semiconductor) IC devices.

Figure 1:
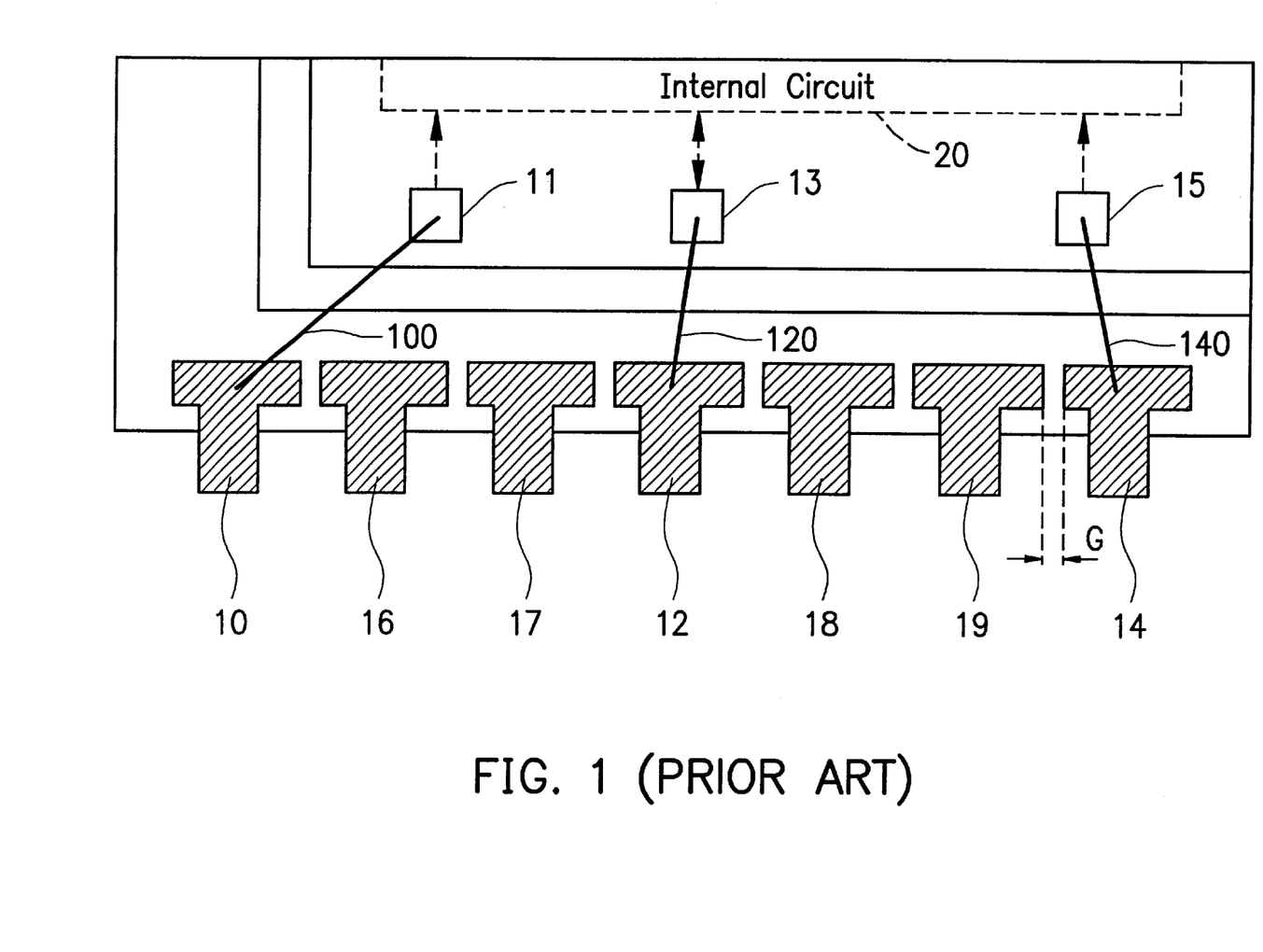
FIG. 1 is a schematic diagram showing a conventional IC package architecture for interconnections between the package pins and the soldering pads of the IC package.

To protect IC packages against ESD damage, various solutions have been proposed. One solution suggests the provision of an ESD protection circuit between the internal circuit of the IC chip and each of the bonding pads. FIG. 1 shows a conventional IC package architecture with ESD protection circuit. As shown, the IC package includes an IC chip on which an internal circuit 20 and a plurality of bonding pads 11, 13, 15 are formed. Further, the IC package includes a plurality of pins 10, 12, 14, 16, 17, 18, 19 on its periphery Of these, pin 10 is a power pin ($V_{DD}/V_{SS}$) which is internally connected via a bonding wire 100 to the bonding pad 11. Pin 12 is an I/O pin, which is internally connected via a bonding wire 120 to the bonding pad 13. Pin 14 is an input pin, which is internally connected via a bonding wire 140 to the bonding pad 15. Pins 16, 17, 18, 19 are not wired and thus are referred to as "no-connect pins". To prevent ESD current from flowing via the bonding pads 11, 13, 15 into the internal circuit 20, each of the bonding pads 11, 13, 15 is connected to an ESD protection circuit (not shown).

One goal in the IC packaging technology is to provide a larger number of pins with a smaller pitch on a single package for high packing density of the pins on the IC package. Since the IC package is very small in size, the increased number of pins will cause the gap between two adjacent pins, as indicated by the reference numeral G in FIG. 1 between the pins 14 and 19, to be further reduced in dimension. The reduction in the gap, however. leads to a new problem in the ESD protection for the IC package. This problem is described in the paper. "New Failure Mechanism due to Non-Wired Pin ESD Stressing", by Matsumoto et al. and published in the 1994 EOS/ESD Symposium, pp. 90–95. This paper reveals the fact that, when a human body model (HBM) ESD pulse is repeatedly applied to a certain no-connect pin on the IC package, any of its two neighboring pins, if wired to the internal circuit, become particularly vulnerable to ESD stress. This is because the electric charge from the ESD stress accumulates in the resin around the no-connect pin, resulting in a large potential difference between the no-connect pin and its neighboring pins that causes the neighboring pins to be vulnerable to ESD stress. In the case of FIG. 1, for example, assume that the input pin 14 is able to withstand a maximum of ESD stress of 3 kV (kilovolt). When an ESD stress of 1.5 kV is applied to the no-connect pin 19, the electric charge from it will accumulate in the resin around the no-connect pin 19. eventually resulting in a large potential difference between the no-connect pin 19 and the input pin 14. When this potential difference reaches a large enough level, it can cause an ESD current (i.e. arc) to flow across the gap G to the neighboring input pin 14. In such an event, this ESD current then flows from the input pin 14 via the bonding wire 140 and the bonding pad 15 to the internal circuit 20. thus resulting in ESD damage to those components that are wired to the input pin 14. In other words, when an ESD stress of 3 kV is applied directly to the input pin 14, the components in the internal circuit 20 that are wired to the pin 14 are not damaged; however, the application of an ESD stress of only 1.5 kV (which is considerably lower than 3 kV) to the neighboring no-connect pin 19 can cause ESD damage to those components that are wired to the input pin 14.

Early types of IC packages include only a small number of pins on them, so the above-mentioned ESD problem hardly ever occurred. However, newer types of IC packages. such as QFP (quad flat packages), MQFP, TQFP, and the like, usually come with more than one hundred pins that are packed in plastic or resin compounds. With such a large number of pins on a small-size IC package, the above-mentioned ESD problem due to the proximate arrangement of the pins becomes a serious consideration. One conventional solution to this problem is to increase the ESD robustness of the input and I/O pins of the IC package to a higher level, for example from 2 kV to 4–5 kV. This scheme can protect the input and I/O pins of the IC package against ESD damage when any one of its neighboring no-connect pins is subjected to an ESD stress of 2 kV. One drawback to this solution, however, is that the ESD protection circuit needed to provide such a level of ESD robustness takes up additional layout area on the IC chip, thus increasing the chip size.

In the package of IC chip, each of the active pins (including input pins, output pins, input/output pins, and power pins other than the no-connect pins) is electrically connected via a bonding pad to an ESD protection circuit. Generally speaking, among these active pins, the power pins (i.e., those pins that are connected to $V_{DD}/V_{SS}$) have the highest ESD robustness since the power pins are connected to either the power bus $V_{DD}$ or the power bus $V_{ss}$, which is connected to associated ESD protection circuits. In addition, a capacitance of about 1 nF (nanofarad) to 10 nF exists between the N-well and P-well; it is capable of absorbing a great amount of the energy from the ESD stress. The I/O pins and the output pins are next to the power pins in ESD robustness, and the input pins have the weakest ESD robustness among the active pins. This is because the I/O pins and output pins are usually connected to a bulk output buffer, while the input pins are not. The output buffer can serve as part of the ESD protection circuit for the I/O pins and output pins, thus allowing the I/O pins and output pins to be higher in ESD protection level than the input pins.

Figure 2A:
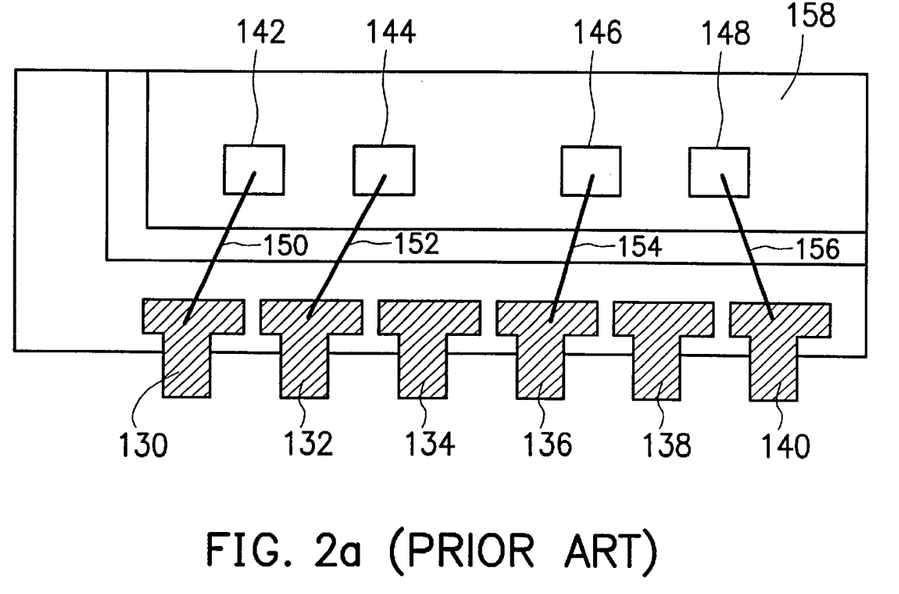
FIGS. 2A–2B are schematic diagrams used to depict two examples of the arrangements and interconnections between package pins and soldering pads of the IC package.

FIGS. 2A and 2B are schematic diagrams used to depict two conventional IC package architectures. Referring first to FIG. 2A, the IC package shown here includes an IC chip 158 having a plurality of bonding pads 142, 144, 146. 148 formed thereon. Furthermore. the IC package includes a plurality of pins 130, 132, 134, 136, 138, 140, which are respectively assigned as a $V_{ss}$ power pin, an input pin, a first no-connect pin, a $V_{DD}$ power pin, a second no-connect pin, and an I/O pin. The $V_{SS}$ power pin 130, the input pin 132, the $V_{DD}$ power pin 136, and the I/O pin 140 are wired respectively via a plurality of bonding wires 150, 152, 154, 156 to the bonding pads 142, 144, 146, 148 on the IC chip 158 so as to be functionally connected to the internal circuit of the IC chip 158. The first and second no-connect pins 134, 138 are unwired.

Figure 2B:
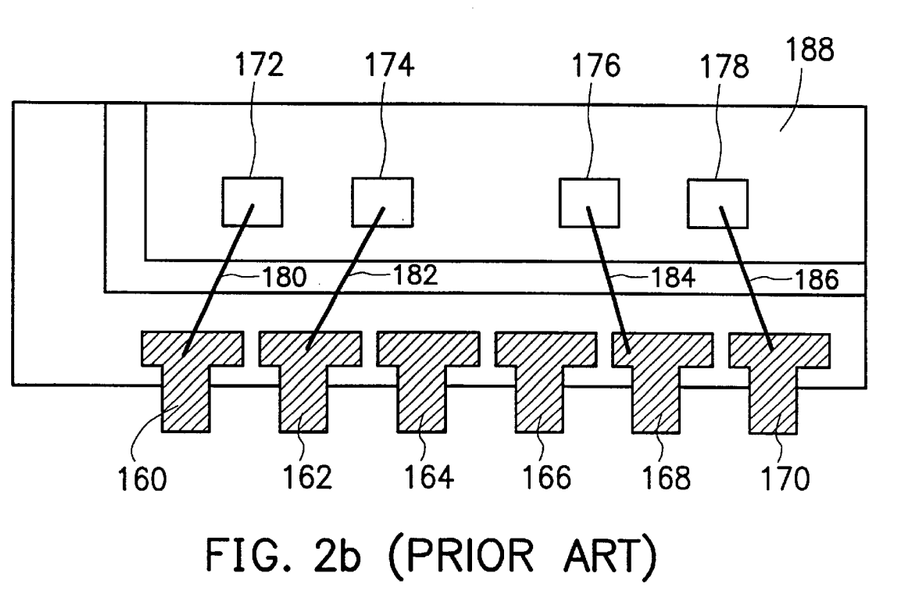

Referring further to FIG. 2B, the IC package shown here includes an IC chip 188 having a plurality of bonding pads 172, 174, 176, 178 formed thereon. Further, the IC package includes a plurality of pins 160, 162, 164, 166, 168, 170, which are respectively assigned as a $V_{SS}$ power pin, an input pin, a first no-connect pin, a second no-connect pin, an I/O pin, and a $V_{DD}$ power pin. The $V_{SS}$ power pin 160, the input pin 162, the I/O pin 168, and the $V_{DD}$ power pin 170 are wired respectively via a plurality of bonding wires 180. 182, 184. 186 to the bonding pads 172, 174, 176, 178 so as to be functionally connected to the internal circuit of the IC chip 188. The first and second no-connect pins 164, 166 are unwired.

It can be seen from FIGS. 2A and 2B that, in the conventional IC package architectures, the no-connect pins are arranged arbitrarily. In the case of FIG. 2A, for example, the no-connect pins are arranged next to the input pin, the $V_{DD}$ power pin, and the I/O pin, while in the case of FIG. 2B, the no-connect pins are arranged next to the input pin and the I/O pin. These pin-assignment schemes take no consideration of ESD protection. Therefore. the arrangement of the no-connect pins next to the ESD sensitive pins, such as the input pins, requires the incorporation of additional ESD protection means for the input pins. thus increasing the chip size.

SUMMARY OF THE INVENTION

It is therefore an objective of the present invention to provide an IC package architecture with ESD protection for use on an IC package, in which the no-connect pins of the IC package are arranged in a particular manner such that the support bars or tie bars on the lead frame are arranged proximate to no-connect pins so as to allow the ESD robustness of the IC package to be further enhanced as compared to the prior art.

It is another objective of the present invention to provide an IC package architecture with ESD protection for use on an IC package, which allows the structural complexity of the IC package to be further simplified as compared to the prior art.

In accordance with the foregoing and other objectives of the present invention, an improved IC package architecture is provided. The IC package architecture with ESD protection according to the invention is provided for use on an IC package including a lead frame having a die pad for mounting an IC chip on it and a plurality of leads serving as the package pins. At least 5 of these pins are no-connect pins and said at least 5 no-connect pins are grouped into at least one separate unit, each unit consisting of one single no-connect pin or a number of consecutively arranged no-connect pins. The IC package architecture of the invention is provided with either of the following ESD protection means: (1) arranging a pair of power pins proximate to the respective sides of the no-connect pin unit; (2) arranging a power pin proximate to one side of the no-connect pin unit and an elongated conductive tongue proximate to the other side; and (3) arranging a pair of elongated conductive tongues proximate to the respective sides of the no-connect pin unit. The power pin can be connected to the system voltage $V_{DD}$, the ground voltage $V_{SS}$ or directly to the ground. The elongated conductive tongue is extended from the die pad to between the internal leads of the first or last no-connect pin in the no-connect pin unit and the neighboring pin. This provides ESD protection to all the no-connect pins in the unit without having to connect them to ESD protection circuits.

BRIEF DESCRIPTION OF DRAWINGS

The invention can be more fully understood by reading the following detailed description of the preferred embodiments with reference made to the accompanying drawings, wherein.

DETAILED DESCRIPTION OF PREFERRED EMBODIMENTS

Figure 3:
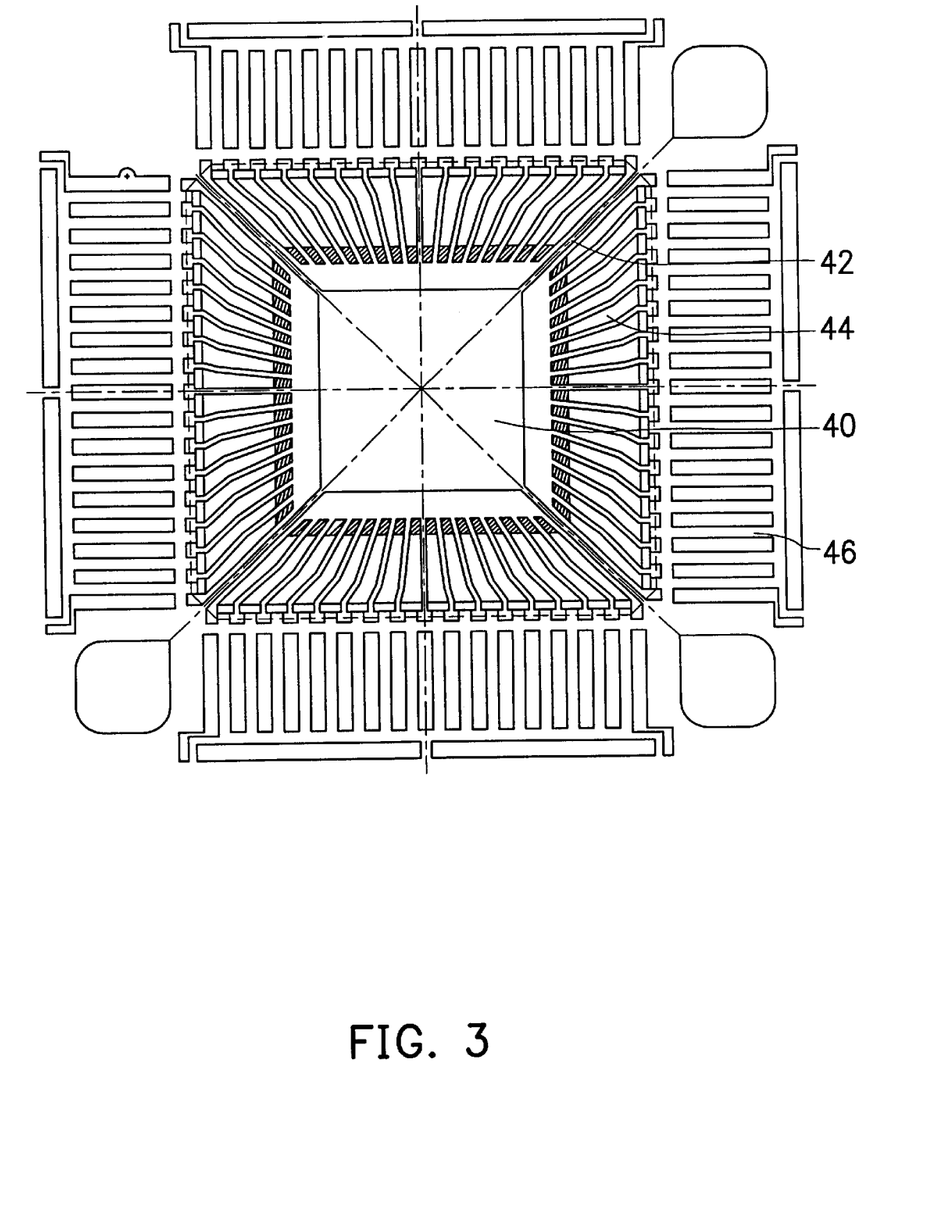
FIG. 3 is a schematic top view of a lead frame for a QFP IC package.

FIG. 3 is a schematic top view of the lead frame for a QFP IC package, which includes a die pad 40, a support bar 42 for supporting the die pad 40, a number of internal leads 44, and a number of external leads 46. Typically, the die pad 40 is used for the mounting of a die (i.e., an IC chip cut apart from the semiconductor wafer) thereon, and can be connected to either the system voltage $V_{DD}$ or ground voltage $V_{SS}$ to supply power to the internal circuit of the IC chip.

Figure 4A:
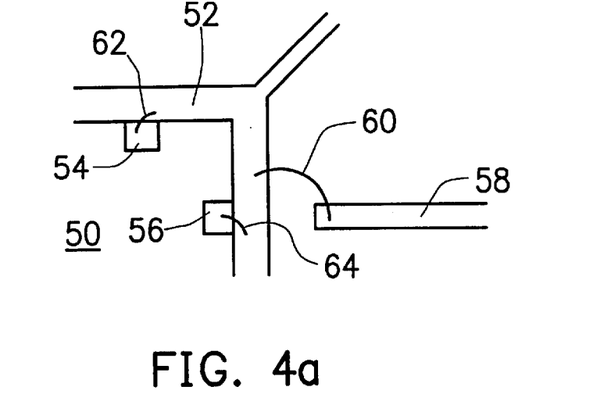
FIGS. 4A–4C are schematic diagrams used to depict three examples of the wiring between the die pad and the power pin of the IC package.
Figure 4B:
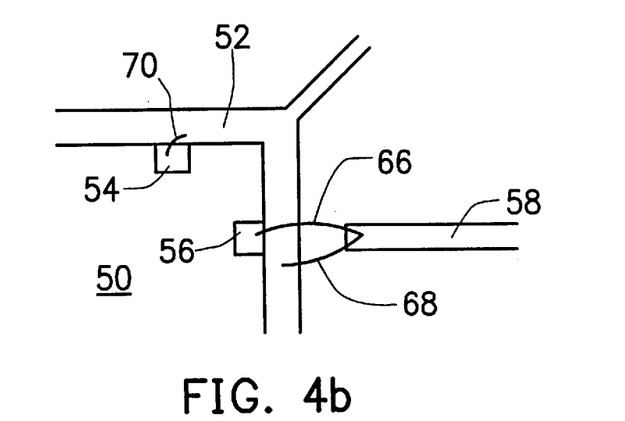
Figure 4C:
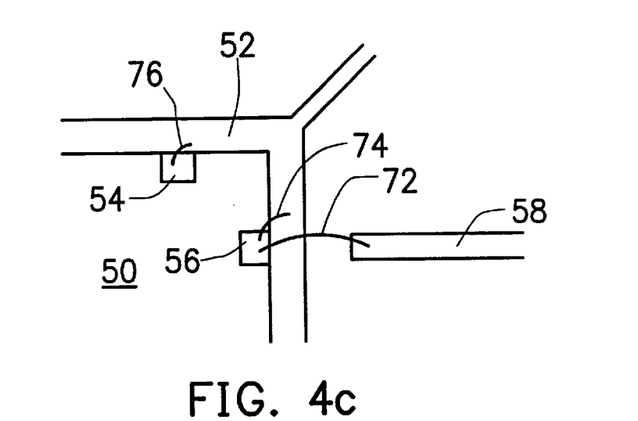

FIGS. 4A–4C are schematic diagrams used to depict three examples of the wiring between the die pad (here designated by the reference numeral 52) and a power pin 58. An IC chip 50 having a plurality of soldering pads (including a first soldering pad 54 and a second soldering pad 56) is mounted on the die pad 52. The power pin 58 can be connected to either the system voltage $V_{DD}$ or the ground voltage $V_{SS}$.

In the scheme of FIGi. 4A, for example, the power pin 58 is connected via a wire 60 to the die pad 52, while the soldering pads 54. 56 are connected respectively via two wires 62, 64 to the die pad 52. As a result of these interconnections, the power pin 58, the soldering pads 54, 56. and the die pad 52 are all set at the same potential.

In the scheme of FIG. 4B, the power pin 58 is connected via a first wire 66 to the soldering pad 56 and via a second wire 68 to the die pad 52, while the other soldering pad 54 is connected via a third wire 70 to the die pad 52. As a result of these interconnections, the power pin 58. the soldering pads 54, 56, and the die pad 52 are all set at the same potential.

In the scheme of FIG. 4C. the power pin 58 is connected via a first wire 72 to the soldering pad 56, which is then connected via a second wire 74 to the die pad 52. The other soldering pad 54 is connected via a third wire 76 to the die pad 52. As a result of these interconnections, the power pin 58, the soldering pads 54, 56, and the die pad 52 are all at the same potential.

In practice, the IC chip 50 can be securely mounted on the die pad 52 by gluing with silver epoxy. Since silver epoxy is electrically conductive, it can electrically connect the substrate of the IC chip 50 to the die pad 52, which is electrically connected to the power pin 58. As a result, the voltage from the power pin 58 can be used to power the IC chip 50. In the case of the IC chip 50 being fabricated on a P-type substrate, the power pin 58 is connected to the ground voltage $V_{SS}$; in the case of an N-type substrate, the power pin 58 is connected to the system voltage $V_{DD}$. Alternatively, the IC chip 50 can be mounted on the die pad 52 by gluing with an electrically insulating adhesive, where the substrate is wired to a first power pin, the die pad 52 is wired to a second power pin, and the first and second power pins are connected respectively to two different voltages. Whichever of the foregoing schemes is used, the support bar is set to the potential at the power pin since the entire lead frame is an electrically conductive body. Therefore, in this case, the support bar can be regarded as a power pin, which can absorb the energy from an ESD stress. Even if the die pad is not electrically connected to any power pins. it still can act as a capacitor due to its relatively large surface area, which allows the support bar to be able to absorb the energy from an ESD stress. From experiments conducted by the inventor, it has been found that the power pin connected to $V_{DD}$ or $V_{SS}$ can provide a relatively large level of ESD protection, and is capable of withstanding an ESD stress as high as 5 kV (kilovolt) applied to any of its neighboring no-connect pins. In terms of ESD protection, the support bar is quite similar to the power pins, which can absorb a considerably large amount of the energy from an ESD stress. Therefore, it can be concluded that, if a no-connect pin is arranged next to a power pin or a support bar, adequate ESD protection can be provided to this no-connect pin.

Figure 5:
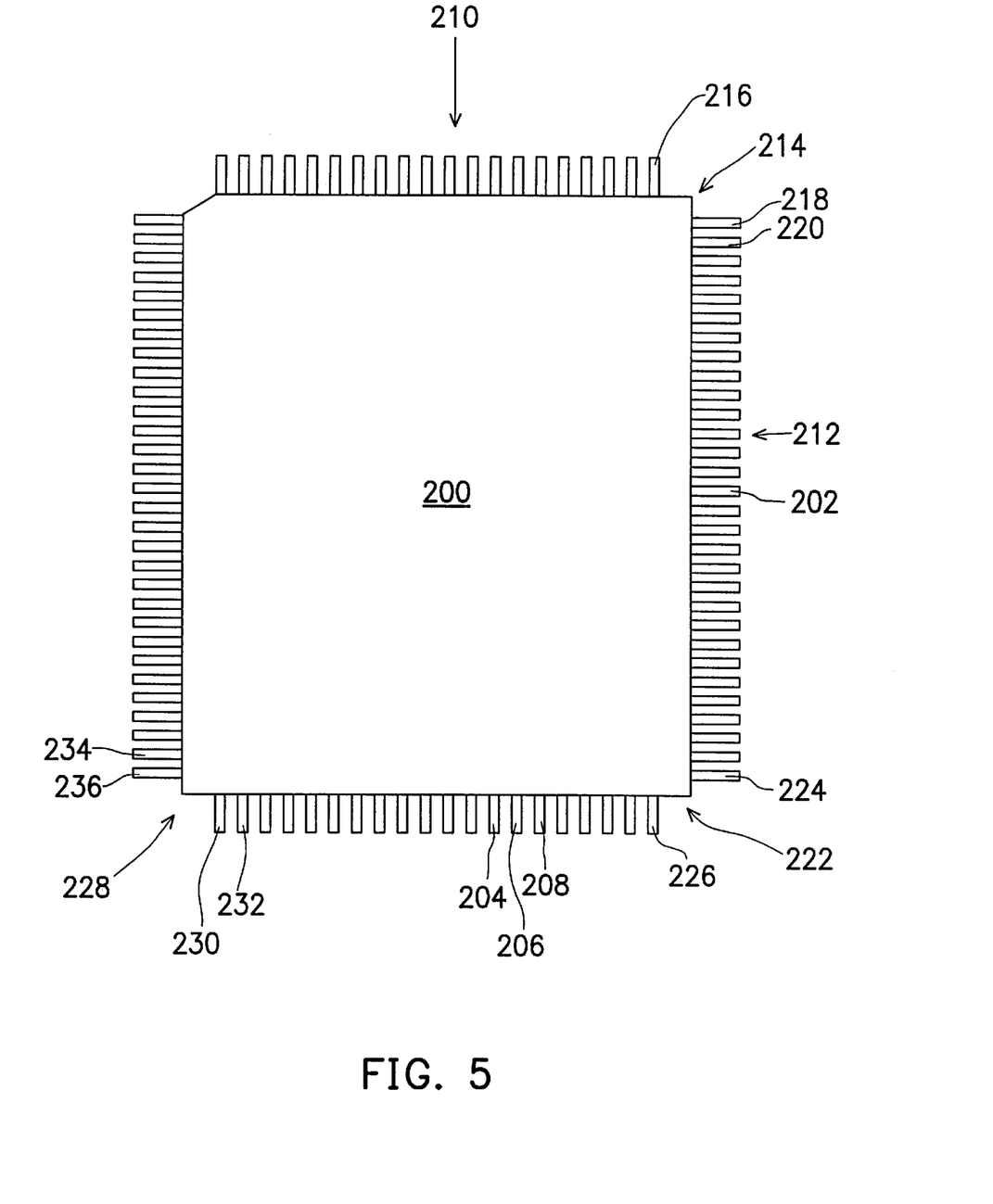
FIG. 5 is a schematic diagram used to depict the various possible arrangements of no-connect pin units.

FIG. 5 is a schematic diagram used to depict the various possible arrangements of no-connect pin units. In the literature of this specification, a no-connect pin unit is defined as a single separate no-connect pin or a group of consecutively arranged no-connect pins. As shown. the IC package comprises a compound 200 and a plurality of package pins including some no-connect pins such as those designated by the reference numerals 216, 218. 220. 202, 224, 226, 208, 206, 204, 232, 230, 236, 234. These no-connect pins are grouped into separate units, each unit consisting of a single no-connect pin (for example, the no-connect pin 202 alone constitutes a no-connect pin unit) or two or more consecutively arranged no-connect pins (for example, the three consecutively arranged no-connect pins 204, 206, 208 in combination constitute a no-connect pin unit). At each corner of the compound 200, the two no-connect pins, if any, on the neighboring two sides are still considered consecutive. For example, at the corner 214, the no-connect pin 216 on the top side 210 of the compound 200 is still considered consecutive to the two no-connect pins 218. 220 on the right side 212; the three no-connect pins 216, 218, 220 are therefore considered to be a no-connect pin unit. Similarly, at the corner 222, the no-connect pin 224 on one side and the no-connect pin 226 on the other side are considered to be a no-connect pin unit, and at the corner 228, the two consecutive no-connect pins 230, 232 on one side and the two consecutive no-connect pins 234, 236 are considered to be a no-connect pin unit. As a general rule, any number of consecutively arranged no-connect pins on the perimeter of the compound 200, irrespective of the four corners of the compound 200, in combination constitute a no-connect pin unit. In the case of FIG. 5, five such no-connect pin units are formed, i.e., (216, 218, 220), (202). (224, 226), (204, 206, 208), and (234, 236, 230, 232). In accordance with the invention, each no-connect pin unit is to be ESD protected by the following three schemes: (1) arranging a pair of power pins proximate to the respective sides of the no-connect pin unit; (2) arranging a power pin proximate to one side of the no-connect pin unit and an elongated conductive tongue proximate to the other side; and (3) arranging a pair of elongated conductive tongues proximate to the respective sides of the no-connect pin unit. The power pin can be connected to the system voltage $V_{DD}$, the ground voltage $V_{SS}$ or directly to the ground GND. The elongated conductive tongue is extended from the die pad to between the internal leads of the first or last no-connect pin in the no-connect pin unit and the neighboring pin.

Figure 6:
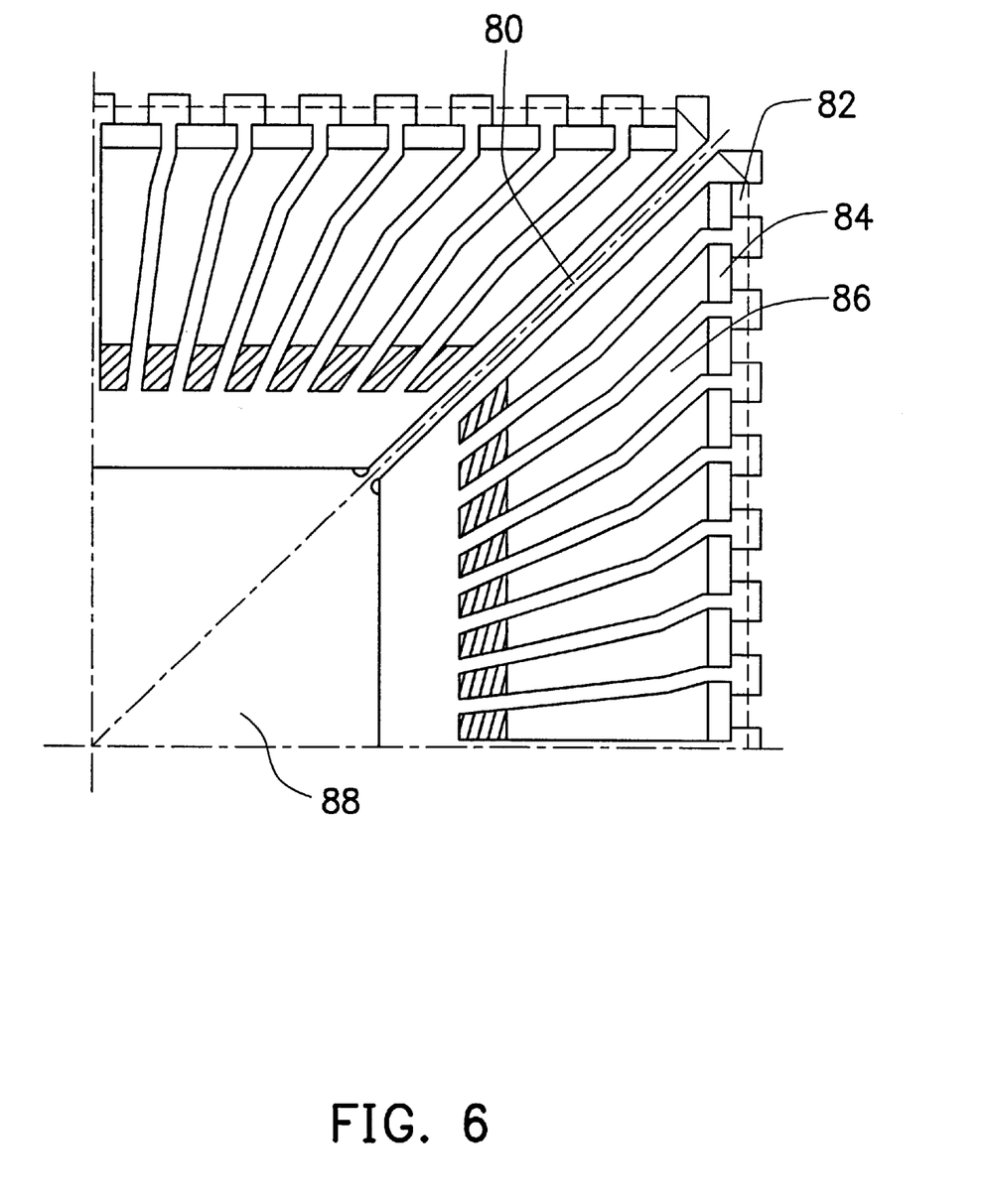
FIG. 6 is a schematic diagram used to depict a first preferred embodiment of the IC package architecture of the invention.

FIG. 6 is a schematic diagram used to depict a first preferred embodiment of the IC package architecture of the invention. In this preferred embodiment, a no-connect pin unit has one end arranged proximate to a power pin and the other end arranged proximate to a support bar. As shown the die pad is here designated by the reference numeral 88, which has a no-connect pin unit consisting of two consecutively arranged no-connect pins 82. 84. In accordance with the invention, one side of the no-connect pin unit (i.e., where the no-connect pin 84 is positioned) is bounded by a power pin 86, which is arranged next to the no-connect pin 84, and the other side of the no-connect pin unit (i.e., where the no-connect pin 82 is positioned) is bounded by a support bar 80, which is arranged between the no-connect pin 82 and its neighboring pin. This provides ESD protection to these two no-connect pins 82, 84 without having to connect them to ESD protection circuits. The ESD protection is effective even if the pin neighboring the no-connect pin 82 is an input pin, since if this is the case, the input pin is isolated by the support bar 80 from the no-connect pin 82.

Figure 7:
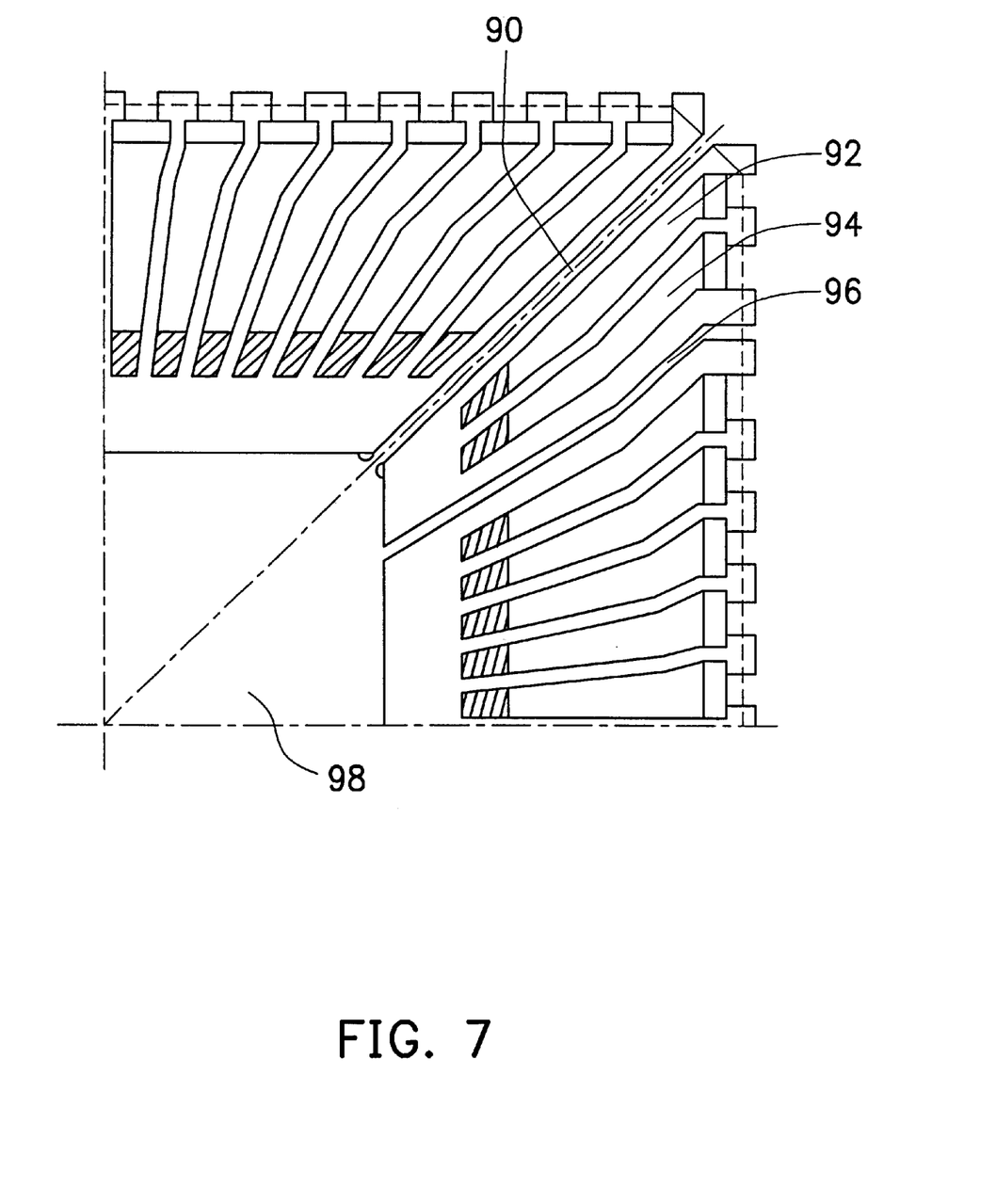
FIG. 7 is a schematic diagram used to depict a second preferred embodiment of the IC package architecture of the invention.

Support bars that are required to provide the above-mentioned ESD protection are preferably provided at the four corners of the die pad, but other places are also feasible. In place of the support bars, elongated conductive tongues can be provided on the perimeter of the die pad, which are extended to between the internal leads of the associated pins. Therefore, if a no-connect pin unit is bounded by a pair of conductive tongues, the application of an ESD stress to any one or ones of the no-connect pins in this unit can hardly cause any ESD damage to the other pins. An example of this IC package architecture is described in the following with reference to FIG. 7. As shown, the die pad is here designated by the reference numeral 98, which has a no-connect pin unit consisting of two consecutively arranged no-connect pins 92, 94. In accordance with the invention a support bar 90 and an elongated conductive tongue 96 are arranged proximate to the respective sides of the no-connect pin unit. The support bar 90 is extended between the no-connect pin 92 and its neighboring pin, while the conductive tongue 96 is extended between the no-connect pin 96 and its neighboring pin. The die pad 98 is electrically wired to a power pin (not shown). This provides ESD protection to the two no-connect pins 92, 94 without having to connect them to ESD protection circuits. The ESD protection is effective even if the pin neighboring the no-connect pin 92 or 94 is an input pin, since if this is the case, the input pin is isolated by the support bar 90 from the no-connect pin 92 or by the conductive tongue 96 from the no-connect pin 94.

As a summary, ESD protection can be provided to any no-connect pin unit on the IC package either by arranging a pair of power pins proximate to the respective sides of the no-connect pin unit, by arranging a power pin proximate to one side of the no-connect pin unit and an elongated conductive tongue proximate to the other side, or by arranging a pair of elongated conductive tongues proximate to the respective sides of the no-connect pin unit. This provides ESD protection to all the no-connect pins in the no-connect pin unit without having to connect them to ESD protection circuits. The structure of the IC package is thus simpler than the structure of the prior art.

The IC package architecture of the invention is characterized in that each separate no-connect pin unit on the IC package, whether consisting of only one single no-connect pin or two or more consecutively arranged no-connect pins, is be bounded by ESD protection means. which can be either power pins or elongated conductive tongues (including support bars). The invention has the benefits of simplifying the structural complexity of the IC package and reducing the chip area due to the fact that no ESD protection circuits are required to be connected to the no-connect pins. The invention is applicable on IC packages that include a number of package pins arranged on the perimeter of the package compound such as QFP packages (including QFP, MQFP, TQFP, and the like). The compound can be formed from plastics or resins. The invention is particularly useful on IC packages with more than 100 package pins, such as 100-pin, 128-pin. and 160-pin packages, of which at least 5 are no-connect pins, or on IC packages with more than 200 package pins, such as 208-pin packages, of which at least 10 are no-connect pins.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. An IC package architecture with ESD protection, said IC package including more than 100 package pins wherein at least 5 of which are no-connect pins, said IC package further including a lead frame having a die pad for mounting an IC chip thereon and a plurality of package pins wherein said at least 5 no-connect pins are grouped into at least one separate unit, each unit consisting of one single no-connect pin or a number of consecutively arranged no-connect pins, said IC package architecture comprising:

an input pin which is connected via a bonding wire to the bonding pad which is connected to an ESD protection circuit;

a power pin or a conductive tongue arranged proximate to a first side of each no-connect pin unit, said conductive tongue being extended from said die pad along the first side of the no-connect pin unit; and a power pin or a conductive tongue arranged proximate to a second side of each no-connect pin unit, said conductive tongue being extended from said die pad along the second side of the no-connect pin unit.

2. The IC package architecture of claim 1, wherein said IC package includes at least 10 no-connect pins.

3. The IC package architecture of claim 1, wherein said IC package includes at least 20 no-connect pins.

4. The IC package architecture of claim 1, wherein said IC package includes more than 100 package pins, of which at least 5 are no-connect pins and the total number of the no-connect pins of the no-connect pin units is equal to the total number of the no-connect pins.

5. The IC package architecture of claim 1, wherein said IC package includes more than 200 package pins, of which at least 10 are no-connect pins and the total number of the no-connect pin units is equal to the total number of the no-connect pins.

6. The IC package architecture of claim 1, wherein said IC package includes one no-connect pin unit, which consists of one no-connect pin only.

7. The IC package architecture of claim 1, wherein said IC package includes one no-connect pin unit which consists of at least two consecutively arranged no-connect pins.

8. The IC package architecture of claim 7, wherein said IC package has a plurality of sides and includes one no-connect pin unit which consists of at least two no-connect pins that are consecutively arranged on one same side of said IC package.

9. The IC package architecture of claim 7, wherein said IC package has a plurality of sides and includes one no-connect pin unit consisting of at least two no-connect pins, of which one is arranged on a first side of said IC package and the other is arranged on a second side neighboring the first side of said IC package.

10. The IC package architecture of claim 1, wherein said IC package is sealed in a resin compound.

11. The IC package architecture of claim 1, wherein said IC package is sealed in a plastic compound.

12. The IC package architecture of claim 1, wherein said IC package is a QFP type IC package.

13. The IC package architecture of claim 1, wherein at least one of said power pin arranged proximate to the first side and said power pin arranged proximate to the second side is connected to a system voltage $V_{DD}$.

14. The IC package architecture of claim 1, wherein at least one of said power pin arranged proximate to the first side and said power pin arranged proximate to the second side is connected to the ground.

15. The IC package architecture of claim 1, wherein said conductive tongue is a support bar of said lead frame.

16. The IC package architecture of claim 1, wherein said die pad is electrically connected to a system voltage bus.

17. The IC package architecture of claim 16, wherein said die pad is wired to a power pin that is electrically connected to the system voltage bus.

18. The IC package architecture of claim 16, wherein said die pad is wired to a soldering pad on the IC chip that is electrically connected to the system voltage bus.

19. The IC package architecture of claim 16, wherein said die pad uses a conductive adhesive to mount the substrate of said IC chip thereon, and the substrate is electrically connected to the system voltage bus.

20. An IC package architecture with ESD protection said IC package including a lead frame having a die pad for mounting an IC chip thereon, a plurality of package pins of which at least 5 are no-connect pins, said at least 5 no-connect pins being grouped into at least one separate no-connect pin unit, each unit consisting of one single no-connect pin or a number of consecutively arranged no-connect pins, said IC package architecture comprising:

an input pin which is connected via a bonding wire to the bonding pad which is connected to an ESD protection circuit;

a power pin or a conductive tongue arranged proximate to a first side of each no-connect pin unit, said conductive tongue being extended from said die pad along the first side of the no-connect pin unit; and a power pin or a conductive tongue arranged proximate to a second side of each no-connect pin unit, said conductive tongue being extended from said die pad along the second side of the no-connect pin unit.

21. The IC package architecture of claim 20, wherein said IC package includes one no-connect pin unit which consists of only one no-connect pin.

22. The IC package architecture of claim 20, wherein said IC package includes one no-connect pin unit which consists of at least two consecutively arranged no-connect pins.

23. The IC package architecture of claim 22, wherein said IC package has a plurality of sides and includes one no-connect pin unit which consists of at least two no-connect pins that are consecutively arranged on one same side of said IC package.

24. The IC package architecture of claim 22, wherein said IC package has a plurality of sides and includes one no-connect pin unit which consists of at least two no-connect pins, of which one is arranged on a first side of said IC package and the other of which is arranged on a second side neighboring the first side of said IC package.

25. The IC package architecture of claim 20, wherein said IC package is sealed in a resin compound.

26. The IC package architecture of claim 20, wherein said IC package is sealed in a plastic compound.

27. The IC package architecture of claim 20, wherein said IC package is a QFP type IC package.

28. The IC package architecture of claim 20, wherein at least one of said power pin arranged proximate to the first side and said power pin arranged proximate to the second side is connected to a system voltage $V_{DD}$.

29. The IC package architecture of claim 20, wherein at least one of said power pin arranged proximate to the first side and said power pin arranged proximate to the second side is connected to the ground.

30. The IC package architecture of claim 20, wherein said conductive tongue is a support bar of said lead frame.

31. The IC package architecture of claim 20, wherein said die pad is electrically connected to a system voltage bus.

32. The IC package architecture of claim 31, wherein said die pad is wired to a power pin that is electrically connected to the system voltage bus.

33. The IC package architecture of claim 31, wherein said die pad is wired to a soldering pad on the IC chip that is electrically connected to the system voltage bus.

34. The IC package architecture of claim 31, wherein said die pad uses a conductive adhesive to mount the substrate of said IC chip thereon, and the substrate is electrically connected to the system voltage bus.

35. The IC package architecture of claim 20, wherein each no-connect pin unit is provided with either of the following ESD protection means:

arranging a pair of power pins proximate to the respective sides of the no-connect pin unit;

arranging a power pin proximate to one side of the no-connect pin unit and an elongated conductive tongue proximate to the other side; and arranging a pair of elongated conductive tongues proximate to the respective sides of the no-connect pin unit.

36. The IC package architecture of claim 20, wherein said IC package includes more than 10 no-connect pins.

37. The IC package architecture of claim 20, wherein said IC package includes more than 20 no-connect pins.

38. The IC package architecture of claim 20, wherein said IC package includes more than 100 package pins of which at least 5 are no-connect pins, and the total number of the no-connect pin units is equal to the total number of the no-connect pins.

39. The IC package architecture of claim 20, wherein said IC package includes more than 200 package pins of which at least 10 are no-connect pins, and the total number of the no-connect pin units is equal to the total number of the no-connect pins.

40. The IC package architecture of claim 20, wherein at least one no-connect pin unit is provided with a proximate conductive tongue.

41. An IC package architecture with ESD protection, said IC package including more than 100 package pins wherein at least 5 of which are no-connect pins, said IC package further including a lead frame having a die pad for mounting an IC chip thereon and a plurality of package pins wherein said at least 5 no-connect pins are grouped into at least one separate unit, each unit consisting of one single no-connect pin or a number of consecutively arranged no-connect pins, said IC package architecture comprising:

an input pin which is connected via a bonding wire to the bonding pad which is connected to an ESD protection circuit;

a power pin or a conductive tongue arranged proximate to a first side of each no-connect pin unit, said conductive tongue being extended from said die pad along the first side of the no-connect pin unit;

a power pin or a conductive tongue arranged proximate to a second side of each no-connect pin unit, said conductive tongue being extended from said die pad along the second side of the no-connect pin unit;

one no-connect pin unit which consists of at least two consecutively arranged no-connect pins; and a plurality of sides, wherein one of said at least two no-connect pins is arranged on a first side of said IC package and the other of said at least two no-connect pins is arranged on a second side neighboring the first side of said IC package.

42. The IC package architecture of claim 41, wherein said IC package is sealed in a plastic compound.

43. The IC package architecture of claim 41, wherein said IC package is a QFP type IC package.

44. The IC package architecture of claim 41, wherein said die pad is electrically connected to a system voltage bus.

45. The IC package architecture of claim 44, wherein said die pad uses a conductive adhesive to mount the substrate of said IC chip thereon, and the substrate is electrically connected to the system voltage bus.

46. An IC package architecture with ESD protection, including a lead frame having a die pad for mounting an IC chip thereon, a plurality of package pins of which at least 5 are no-connect pins, said at least 5 no-connect pins being grouped into at least one separate no-connect pin unit, each unit consisting of one single no-connect pin or a number of consecutively arranged no-connect pins, said IC package architecture comprising:

a power pin or a conductive tongue arranged proximate to a first side of each no-connect pin unit, said conductive tongue being extended from said die pad along the first side of the no-connect pin unit;

a power pin or a conductive tongue arranged proximate to a second side of each no-connect pin unit, said conductive tongue being extended from said die pad along the second side of the no-connect pin unit;

one no-connect pin unit which consists of at least two consecutively arranged no-connect pins; and a plurality of sides, wherein one of said at least two no-connect pins is arranged on a first side of said IC package and the other of said at least two no-connect pins is arranged on a second side neighboring the first side of said IC package.

47. The IC package architecture of claim 46, wherein said IC package is sealed in a plastic compound.

48. The IC package architecture of claim 46, wherein said IC package is a QFP type IC package.

49. The IC package architecture of claim 46, wherein said die pad is electrically connected to a system voltage bus.

50. The IC package architecture of claim 49, wherein said die pad uses a conductive adhesive to mount the substrate of said IC chip thereon, and the substrate is electrically connected to the system voltage bus.

51. An IC package architecture with ESD protection, including a lead frame having a die pad for mounting an IC chip thereon, a plurality of package pins of which at least 5 are no-connect pins, said at least 5 no-connect pins being grouped into at least one separate no-connect pin unit, each unit consisting of one single no-connect pin or a number of consecutively arranged no-connect pins, said IC package architecture comprising:

a power pin or a conductive tongue arranged proximate to a first side of each no-connect pin unit, said conductive tongue being extended from said die pad along the first side of the no-connect pin unit;

a power pin or a conductive tongue arranged proximate to a second side of each no-connect pin unit, said conductive tongue being extended from said die pad along the second side of the no-connect pin unit; and more than 100 package pins of which at least 5 are no-connect pins, and the total number of the no-connect pins in said no-connect pin units is equal to the total number of the no-connect pins in said IC package.

52. The IC package architecture of claim 51, wherein said IC package is sealed in a plastic compound.

53. The IC package architecture of claim 51, wherein said IC package is a QFP type IC package.

54. The IC package architecture of claim 51, wherein said die pad is electrically connected to a system voltage bus.

55. The IC package architecture of claim 54, wherein said die pad uses a conductive adhesive to mount the substrate of said IC chip thereon, and the substrate is electrically connected to the system voltage bus.

* * * * *